United States Patent

Hsieh et al.

[11] Patent Number: 5,950,087
[45] Date of Patent: Sep. 7, 1999

[54] METHOD TO MAKE SELF-ALIGNED SOURCE ETCHING AVAILABLE IN SPLIT-GATE FLASH

[75] Inventors: Chia-Ta Hsieh, Tainan; Yai-Fen Lin, Taichung; Hung-Cheng Sung; Jaung-Ke Yeh, both of Hsin-Chu; Kuo-Reay Peng, Fung-San; Di-Son Kuo, Hsinchu, all of Taiwan

[73] Assignee: Taiwan Semiconductor Manufacturing Company, Ltd., Hsin-Chu, Taiwan

[21] Appl. No.: 09/151,154

[22] Filed: Sep. 10, 1998

[51] Int. Cl.⁶ ............................................. H01L 21/336
[52] U.S. Cl. .................................... 438/264; 438/266
[58] Field of Search ................................. 438/257, 258, 438/261, 262, 263, 264, 266, 267, 588

[56] References Cited

U.S. PATENT DOCUMENTS

| | | | |
|---|---|---|---|
| 5,045,488 | 9/1991 | Yeh | 438/257 |
| 5,274,588 | 12/1993 | Manzur et al. | 365/185 |
| 5,278,087 | 1/1994 | Jenq | 438/264 |
| 5,371,028 | 12/1994 | Koh | 438/261 |
| 5,427,968 | 6/1995 | Hong | 437/43 |
| 5,495,441 | 2/1996 | Hong | 365/185.01 |
| 5,569,945 | 10/1996 | Hong | 257/316 |
| 5,766,997 | 6/1998 | Takeuchi | 438/257 |
| 5,811,853 | 9/1998 | Wang | 438/267 |
| 5,858,840 | 1/1999 | Hsieh et al. | 438/266 |
| 5,872,036 | 2/1999 | Sheu | 438/266 |
| 5,879,992 | 3/1999 | Hsieh et al. | 438/266 |
| 5,879,993 | 3/1999 | Chien et al. | 438/266 |

*Primary Examiner*—Chandra Chaudhari
*Assistant Examiner*—Jack Chen
*Attorney, Agent, or Firm*—George O. Saile; Stephen B. Ackerman

[57] ABSTRACT

A method is provided for forming a common self-aligned source line in order to reduce the number of surface contacts and at the same time alleviate the field oxide encroachment into the cell area. Thus, the size of the split-gate flash memory is substantially reduced on both accounts. This is accomplished by forming a buffer polysilicon layer over the floating gate to serve as an etch stop to protect the first poly-oxide of the floating gate during the self-aligned source etching.

38 Claims, 5 Drawing Sheets

METHOD TO MAKE SELF-ALIGNED SOURCE ETCHING AVAILABLE IN SPLIT-GATE FLASH

BACKGROUND OF THE INVENTION (1) Field of the Invention

The present invention relates to split-gate memory cells used in flash EEPROMs (Electrically Erasable Programmable Read Only Memories), and in particular, to a method of forming self-aligned source and source line by performing judicious etching.

(2) Description of the Related Art

A split-gate flash memory cell is formed similar to the forming of a field effect transistor, with the addition of a floating gate between the control gate conductor and the conduction channel of the transistor. The bit state of a cell depends upon the charge on the insulated floating gate, with the voltage needed to charge the floating gate depending upon the coupling coefficient between a program gate and the underlying floating gate. The size and shape of the areas comprising the memory cell determine to a large extent its functional properties erase speed and programmability being the important ones.

Thus, the dimensions of the source and source line, and in particular the presence of the so-called "bird's beak", which is described below more in detail in relation to nonvolatile memories, play an important role in transferring current to and fro between the substrate and the floating gate, and hence the charging speed of the memory cell, and the amount of surface current leakage that takes place around and near the bird's beak. At the same time, the dimensions of the source and the extent to which there is encroachment of the bird's beak together determine the overall size of the cell, and hence that of the bit density. It is disclosed in the present invention a method of self-aligned source etching whereby bird's beak encroachment into the field oxide is reduced and the memory array size can also be substantially reduced. It is also shown that the area assigned to the cell can be minimized by reducing the number of surface contacts through the use of a common self-aligned source line and providing contacts at the ends of the source line.

A flash memory is a nonvolatile read-only memory (ROM), and among the nonvolatile ROMs, such as masked-ROMs, Electrically Programmable (EP-ROMs), EEPROMs have been known as one type of nonvolatile memory semiconductor devices capable of electrically writing and erasing information. However, EEPROMs require two transistors to operate. In Flash EEPROM, the memory cell includes one transistor, and the contents of all the memory's cells can be erased simultaneously through the use of an electrical erase signal. Hence, with Flash memory, in addition to gaining speed in having the cells erased much more rapidly, higher levels of integration can be achieved with fewer devices.

The unit cell of an EEPROM memory device is usually comprised of a silicon substrate provided with a source and a drain, and two polysilicon gates; that is, a MOS transistor having a channel defined by the source and drain regions, a floating gate to which there is no direct electrical connection and a control gate with a direct electrical connection. The floating gate is separated from the substrate by an insulating layer of, for example, silicon oxide. The control gate is generally positioned over the floating gate with a layer of insulating material separating the two gates. To program a transistor, charge is transferred from the substrate through the insulator and is stored on the floating gate of the transistor. The amount of charge is set to one of two levels to indicate whether the cell has been programmed "on" or "off". "Reading" of the cell's state is accomplished by applying appropriate voltages to the cell source and drain, and to the control gate, and then sensing the amount of charge on the floating gate. To erase the contents of a cell, the programming process is reversed, namely, charges are removed from the floating gate by transferring them back to the substrate through the insulator. In "flash" memories, the entire array of memory cells, or a significant subset thereof, is erased simultaneously. Flash EEPROMs combine the advantages of UV-erasable EPROMS and floating-gate EEPROMs. They offer high density, small cell size, the well-known hot-electron writeability of EPROMs, together with the easy reusability, on-board reprogrammability, and electron-tunneling erasure feature of EEPROMs (See S. Wolf, "Silicon Processing for the VLSI Era," vol. 2, Lattice Press, Sunset Beach, Calif., 1990, pp. 632–634.)

Programming and erasing of an EEPROM is accomplished electrically and in-circuit by using Fowler-Nordheim tunneling as is well known in prior art. Basically, a sufficiently high voltage is applied to the control gate and drain while the source is grounded to create a flow of electrons in the channel region in the substrate. Some of these electrons gain enough energy to transfer from the substrate to the floating gate through the thin oxide layer by means of Fowler-Nordheim tunneling. The tunneling is achieved by raising the voltage level on the control gate to a sufficiently high value of about 12 volts. As the electronic charge builds up on the floating gate, the electric field is reduced, which reduces the electron flow. When, finally, the high voltage is removed, the floating gate remains charged to a value larger than the threshold voltage of a logic high that would turn it on. Thus, even when a logic high is applied to the control gate, the EEPROM remains off. Since tunneling process is reversible, the floating gate can be erased by grounding the control gate and raising the drain voltage, thereby causing the stored charge on the floating gate to flow back to the substrate. Of critical importance in the tunneling region is the quality and the thinness of the tunneling oxide separating the floating gate from the substrate. Usually a thickness of between about 80 to 120 Angstroms is required to facilitate Fowler-Nordheim tunneling.

Figure 1:
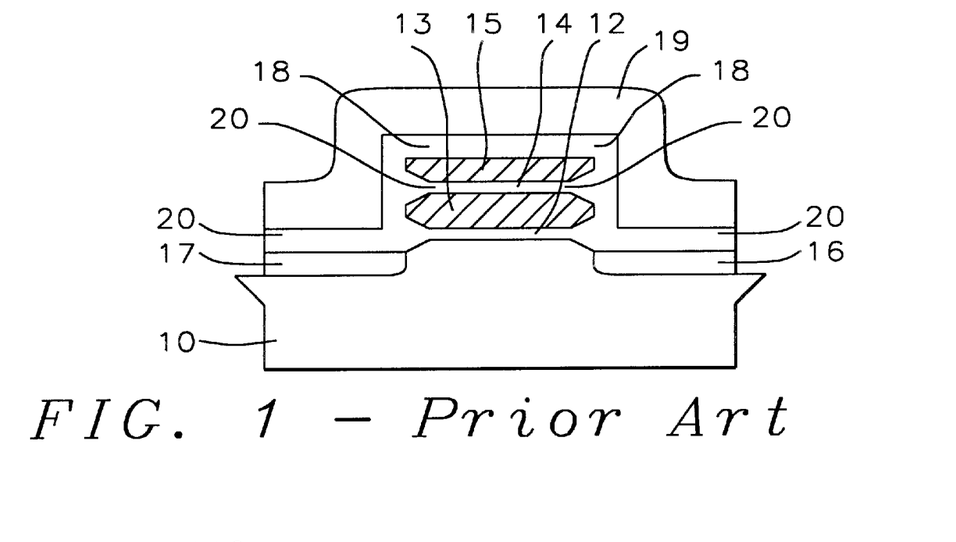
FIG. 1 is a partial-cross sectional view of a Flash EEPROM of prior art.

A cross section of a conventional Flash EEPROM is shown in FIG. 1. Drain impurity diffusion layer (16) and a source impurity diffusion layer (17) are formed on a main surface of the semiconductor substrate (10) and are spaced from each other by a predetermined distance with a channel region therebetween. The conventional Flash EEPROM further includes a floating gate electrode (13) formed on the channel region with a first gate oxide film (12) therebetween, a control gate electrode (15) formed on the floating gate electrode (13) with an insulating film (14) therebetween, an interlayer thermal oxide film (18) covering the semiconductor substrate (10), floating gate electrode (13) and control gate electrode (15), and an interlayer insulating film (19) covering the interlayer thermal oxide film (18). Gate bird's beak oxide films (20) are formed at opposite ends of the first gate oxide film (12) and opposite end of the insulating film (14). The interlayer insulating film (19) contains impurity such as boron or phosphorous. The purpose of the interlayer thermal oxide film (18) is to prevent the movement of impurity such as boron of phosphorous of the interlayer insulating film (19) into the semiconductor substrate (10), control gate electrode (15) or floating gate electrode (13) and thus to prevent change of the electrical characteristics thereof.

After the final step of forming the interlayer insulating film (19) to cover the interlayer thermal oxide film (18)

shown in FIG. 1, usually heat treatment by a reflow method is carried out to flatten the interlayer insulating film (19). During this process as well as during thermally growing the thermal oxide layer (18) by means of wet oxidation, oxidizer ($H_2O$) penetrates the interlayer insulating film (19) and interlayer thermal oxide film (18). This causes further oxidization between the semiconductor substrate (10) and the ends of the floating gate electrode (13), and between the control gate electrode (15) and the floating gate electrode (13). As a result, the gate bird's beak oxide films (20) are formed. Consequently, the lower end of the floating gate electrode (13) contacts the gate bird's beak oxide films (20) so that the lower end of the floating gate electrode (13) is oxidized to a large extent as compared with the other portions.

The gate bird's beak oxide film (20) can form either at the lower end of the floating gate (13) and the source impurity diffusion layer (17), or at the lower end of the floating gate near the drain impurity diffusion layer (16), or at both locations. In these cases, the conventional "beak" of the bird's beak is usually long and elongated, thus increasing the size of the cell and at the same time providing paths for current leakage and, therefore, low memory speed.

Related art teaches methods of forming split-gate memories. Manzur in U.S. Pat. No. 5,274,588 discloses a split gate EEPROM where source junction is self-aligned to floating gate, and is graded for efficient erase. Hong in U.S. Pat. No. 5,569,945 teaches the forming of a stepped floating gate in a different ROM. Hong teaches a split-gate memory cell with separated tunneling regions. In U.S. Pat. No. 5,427,968, Hong shows a ring-shaped floating gate surrounding and covering the periphery of the channel and is isolated from the drain and source regions, respectively, by two thin tunneling oxide layers that are separated from each other. A control gate layer covers the ring-shaped floating gate and the portion of the channel that is note covered by the floating gate layer, and is separated from the floating gate by an isolation layer. A gate oxide layer is formed between the control gate layer and channel. Two other patents, namely, U.S. Pat. No. 5,652,161 by Ahn and U.S. Pat. No. 5,495,441 by Hong also disclose methods of making split-gate flash memory cells. The present invention differs from prior art in that a method of forming a common self-aligned source line is disclosed with the additional advantage of having reducing encroachment which in turn reduces the memory cell size.

SUMMARY OF THE INVENTION

It is therefore an object of this invention to provide a method of forming a self-aligned common source line by a judicious use of a buffer polysilicon and an etch step thereof.

It is another object of this invention to provide a method of forming a self-aligned common source line by reducing encroachment of the filed oxide into the cell.

It is yet another object of this invention to provide a method of forming a split-gate memory cell with reduced size due to the reduction of oxide encroachment into each cell and due to the lack of necessity for individual source contacts for individual cells in the presence of a common source line.

These objects are accomplished by providing a semiconductor substrate; forming active and passive regions in said substrate; forming a floating gate oxide layer over said substrate; forming a first polysilicon layer over said floating gate oxide layer; forming a nitride layer over said first polysilicon layer; forming a first photoresist mask having a floating gate pattern over said floating gate oxide layer; etching into said nitride layer through said floating gate pattern in said photoresist mask; removing said first photoresist mask; oxidizing said first polysilicon layer to form a first poly-oxide; forming a buffer polysilicon layer;

removing a portion of said buffer polysilicon layer; oxidizing said buffer polysilicon layer to form a buffer poly-oxide; removing said nitride layer; etching said first polysilicon layer using said first poly-oxide as a hard mask until reaching said floating gate oxide layer; forming an interpoly oxide layer; forming a second polysilicon layer over said interpoly oxide layer; forming a second photoresist mask having a control gate pattern over said second polysilicon layer; etching through said second photoresist mask to form control gate pattern into said second polysilicon layer; removing said second photoresist mask; forming a third photoresist mask over said second control gate and defining a self-aligned source pattern; etching through said third photoresist mask to remove portions of field oxide to form a continues common source line; ion implanting to form source regions; and removing said third photoresist mask to continue to completion the remaining standard steps of manufacturing split-gate flash memory substrate.

DESCRIPTION OF THE PREFERRED EMBODIMENTS

Referring now to the drawings, in particular to FIGS. 2A–2M, there are shown schematically steps of forming a split-gate flash memory with a self-aligned common source line spanning across field oxide regions.

Figure 2A:
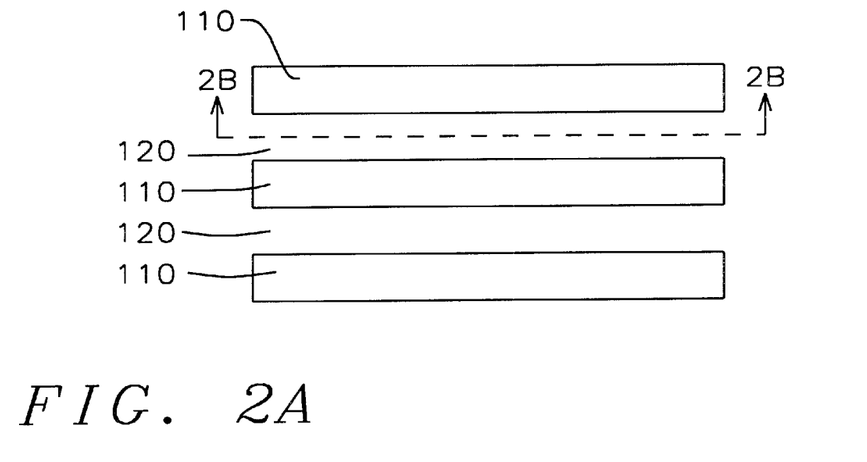
FIG. 2A is a top view of a partially completed semiconductor substrate showing field oxide and active regions defined, according to this invention.
Figure 2B:
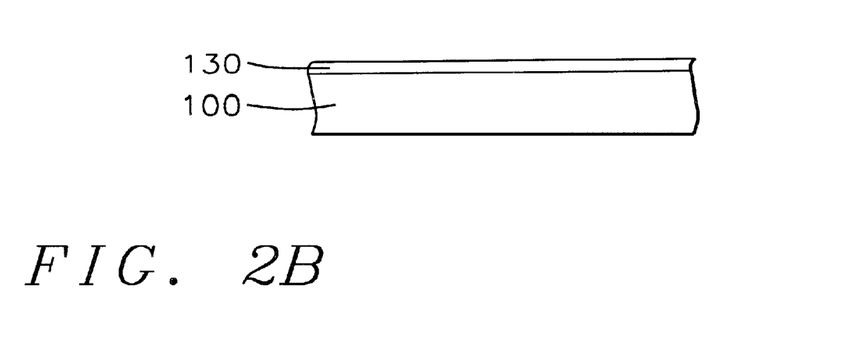
FIG. 2B is a cross-sectional view of the partially completed semiconductor substrate of FIG. 2A showing the forming of the floating gate oxide layer, according to this invention.

FIG. 2A shows a top view of a partially completely semiconductor substrate, preferably silicon, where strips of field oxide (110) regions and active (120) regions have been formed. A cross-sectional view of the same substrate, (100) is shown in FIG. 2B which corresponds to a view taken at 2B—2B in FIG. 2A. The field oxide regions are formed with a masking layer, such a silicon nitride (not shown), deposited on the substrate surface in order to mask the underlying substrate against oxidation. The exposed unmasked surface is oxidized, usually using the well known LOCOS process, to grow a thermal oxide which in effect sinks into the silicon at the unmasked areas. The masked silicon remains as a mesa surrounded by the sunken silicon dioxide that is available for fabrication of devices. Silicon oxide can be grown at atmospheric pressure and at a temperature between about 750 to 1250° C. in a wet ambient in a thermal furnace.

Next, a floating gate oxide (so called because it will serve as an insulating oxide layer between the substrate and the floating gate to be formed), layer (130) shown in FIG. 2B, is formed on the substrate surface. The gate oxide layer can be formed by thermally growing it at a temperature between about 850 to 1100° C. In the alternative, the gate oxide layer can be formed by an atmospheric or low pressure chemical vapor deposition process as is well known. It is preferred that floating gate oxide layer (130) has a thickness between about 50 to 100 Å. This is followed by forming a first polysilicon layer (140) over the gate oxide through methods including but not limited to Low Pressure Chemical Vapor Deposition (LPCVD) methods, Chemical Vapor Deposition (CVD) methods and Physical Vapor Deposition (PVD) sputtering methods employing suitable silicon source materials, preferably formed through a LPCVD method employing silane $SiH_4$ as a silicon source material at a temperature range between about 500 to 650° C.The preferred thickness of first polysilicon layer (140) is between about 800 to 1500 angstroms (Å) .

Figure 2C:
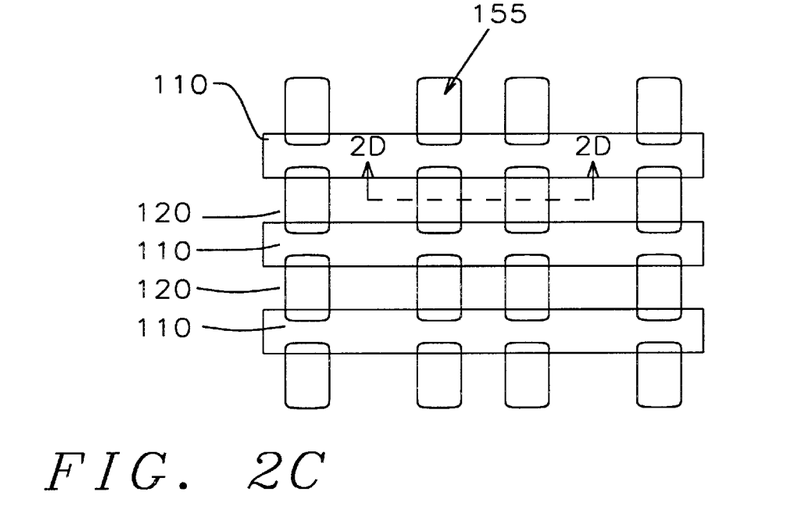
FIG. 2C is a top view of the same substrate of FIG. 2A showing the forming of openings in the nitride layer corresponding to cell areas of this invention.
Figure 2D:
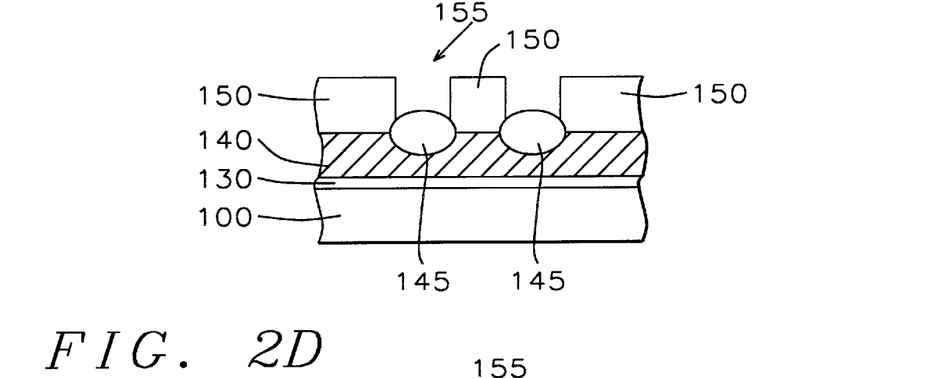
FIG. 2D is a cross-sectional view of the partially competed semiconductors substrate of FIG. 2C showing the oxidation of the polysilicon layer exposed in the openings of this invention.
Figure 2E:
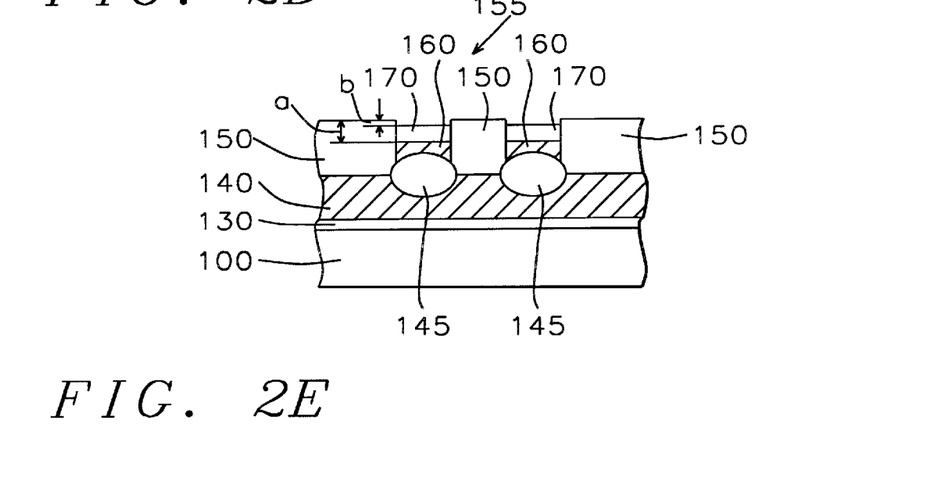
FIG. 2E is a cross-sectional view of the partially competed semiconductors substrate of FIG. 2D showing the forming of the buffer polysilicon layer and the oxidation thereof, according to this invention.
Figure 2F:
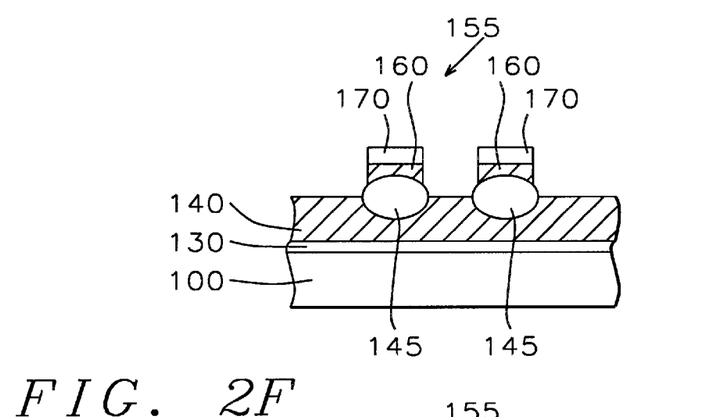
FIG. 2F is a cross-sectional view of the partially competed semiconductors substrate of FIG. 2E showing the etching of the buffer oxide and buffer polysilicon of this invention.

A third layer, namely, nitride layer (150), is next deposited over polysilicon layer (140) by reacting dichlorosilane ($SiCl_2H_2$) with ammonia ($NH_3$) in an LPCVD at a temperature between about 750 to 850° C., and to a thickness between about 500 to 1500 Å. Openings (155) corresponding to cell areas in active regions (120) in the substrate are first formed in nitride layer (150) by using an etch recipe comprising gases $CF_4$, $CHF_3$, Ar. This is accomplished by forming a patterned photoresist layer to a thickness between about 1 to 1.2 μm, which now serves as a photoresist mask (not shown) defining the floating gate over the cell area and then etching the nitride layer through the cell patterns in the photoresist mask. The photoresist mask is removed afterwards by oxygen plasma ashing. It will be noted in the top view shown in FIG. 2C that cell openings (155) straddle active regions (120). A cross-sectional view of the substrate taken at 2D—2D in FIG. 2C is shown in FIG. 2D. The first polysilicon layer exposed in openings (155) is next oxidized in a wet environment at a temperature between about 850 to 1100° C. to form poly-oxide (145) as shown in FIG. 2D. The preferred thickness of the poly-oxide is between about 800 to 1700 Å.

As a main feature and key aspect of the present invention, an intermediate layer of buffer polysilicon is formed using LPCVD with silane $SiH_4$ as before at a temperature range between about 500 to 650° C. This buffer layer (160) shown in FIG. 2E will serve as a self-aligned source etch stop at a later process step in the forming of the memory cell of the present invention. Furthermore, buffer layer (160) is also oxidized by wet oxidation at a temperature between about 850 to 1100° C. to form a buffer poly-oxide (170) shown in the same FIG. 2E. However, prior to the forming of the buffer oxide, it is important that the buffer polysilicon as deposited (not shown) is first partially removed by chemical mechanical polishing so that it is below the level of the opening (155). It is preferred that the depth (a) of the buffer polysilicon prior to oxidation is between about 500 to 1200 Å, and after oxidation depth (b) is between about 250 to 600 Å.

Figure 2G:
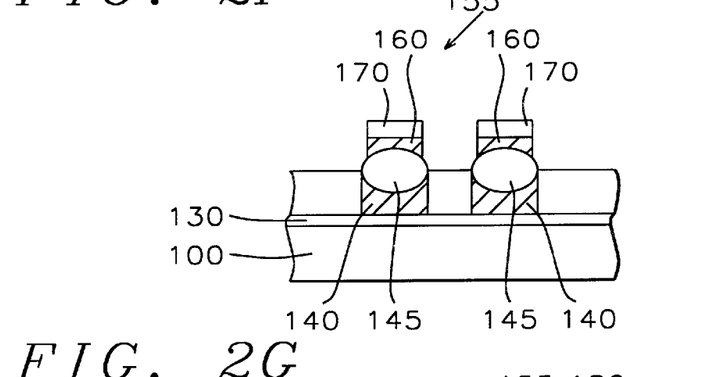
FIG. 2G is a cross-sectional view of the partially competed semiconductor substrate of FIG. 2F showing the forming of the floating gate of this invention.

After forming buffer poly-oxide (170), to a depth between about 250 to 600 Å. The nitride layer is removed by using a wet etch recipe comprising $H_3PO_4$ solution forming phosphoric acid. Next, using both buffer poly-oxide (170) and first poly-oxide (145) as hard masks, the first polysilicon layer is etched to form floating gate (140) as shown in FIG. 2G. The etch recipe comprises HBr, $Cl_2$ and $O_2$, and with high selectivity to the floating gate oxide layer (130).

Figure 2H:
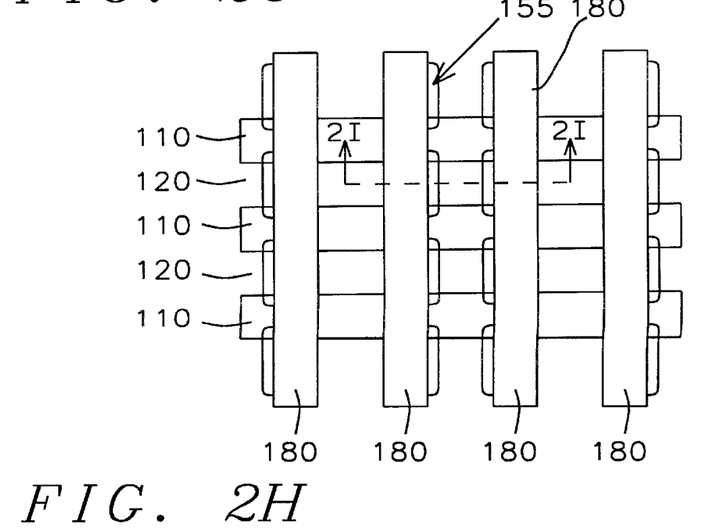
FIG. 2H is a top view of the same substance of FIG. 2G showing the forming of the second polysilicon layer of this invention.
Figure 2I:
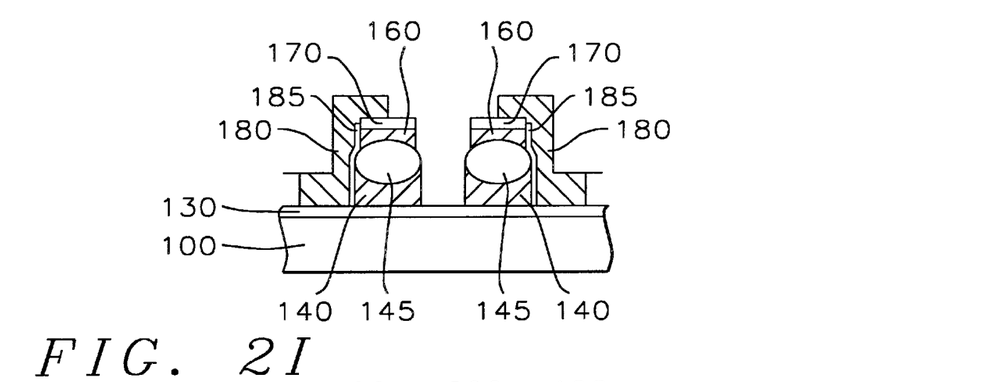
FIG. 2I is a cross-sectional view of the partially competed semiconductor substrate of FIG. 2H showing the forming of the control gate of this invention.

Next, a conformal interpoly oxide layer (185) is grown over the substrate at a temperature between about 850 to 1100° C. The preferred thickness of the interpoly oxide is between about 150 to 300 Å. Subsequently, a second polysilicon layer is formed and patterned with a second patterned photoresist layer, having a thickness between about 0.9 to 1.0 μm, (not shown) to form control gate (180) as shown in FIG. 2I. Subsequently, the second photoresist layer is removed by oxygen plasma ashing. FIG. 2I is the cross-sectional view taken at 2I—2I shown in the top view of the substrate shown in FIG. 2H. The second polysilicon layer (180) is also shown in FIG. 2H and is formed using the previously stated LPCVD method employing silane $SiH_4$ as a silicon source material at a temperature range between about 500 to 650° C. The preferred thickness of layer (180) is between about 1000 to 2000 Å.

Figure 2J:
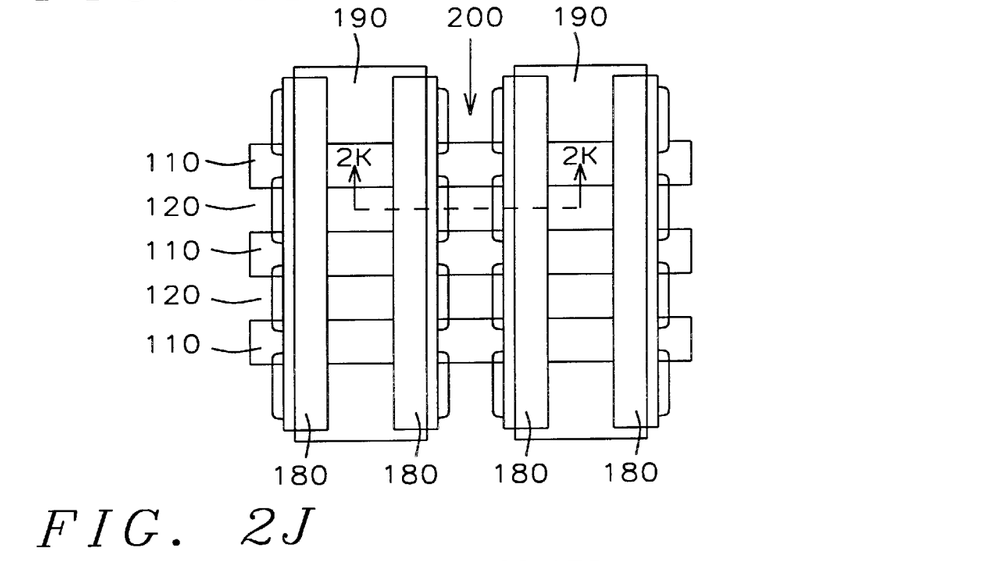
FIG. 2J is a top view of the same substrate of FIG. 2I showing the forming of the continuos self-aligned source line of this invention.
Figure 2K:
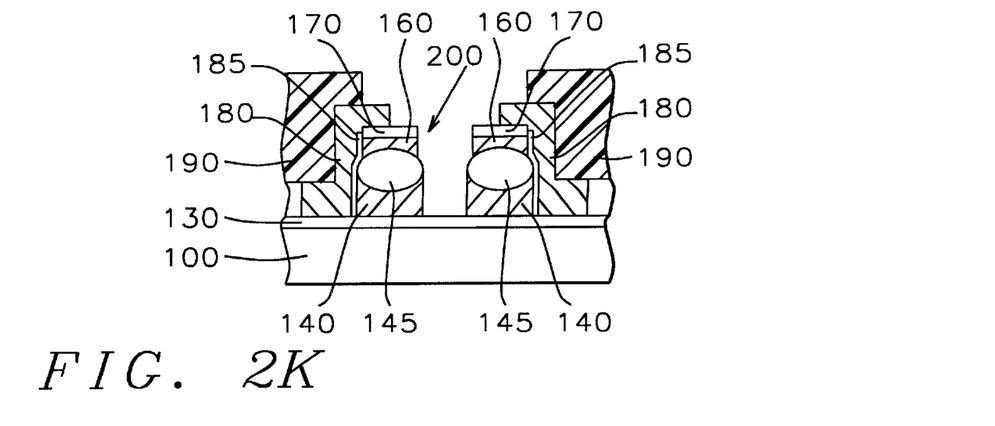
FIG. 2K is a cross-sectional view of the partially competed semiconductor substrate of FIG. 2J showing a cross-sectional view of the continuos self-aligned source line of this invention.
Figure 2L:
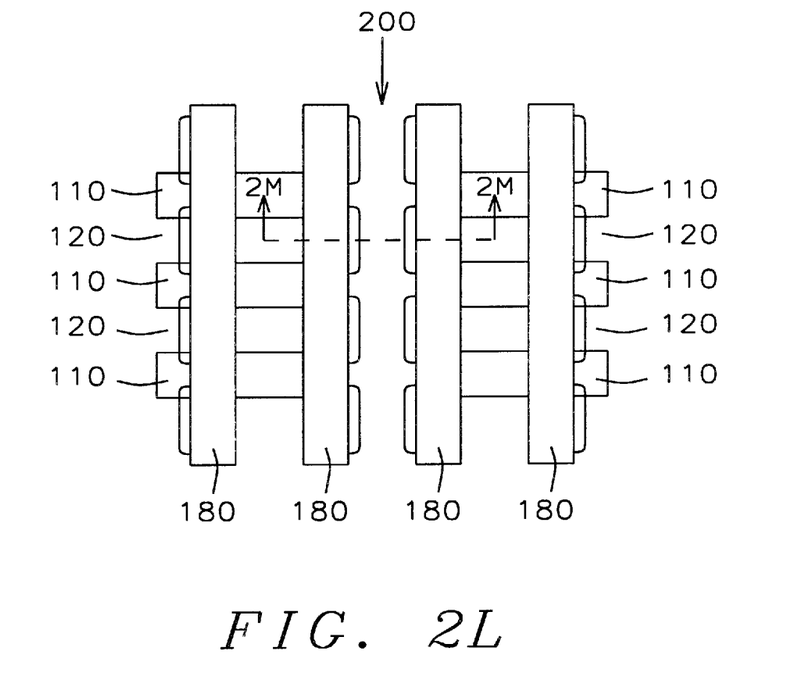
FIG. 2L is a top view of the same substrate of FIG. 2K after the removal of the third photoresist, according to this invention.
Figure 2M:
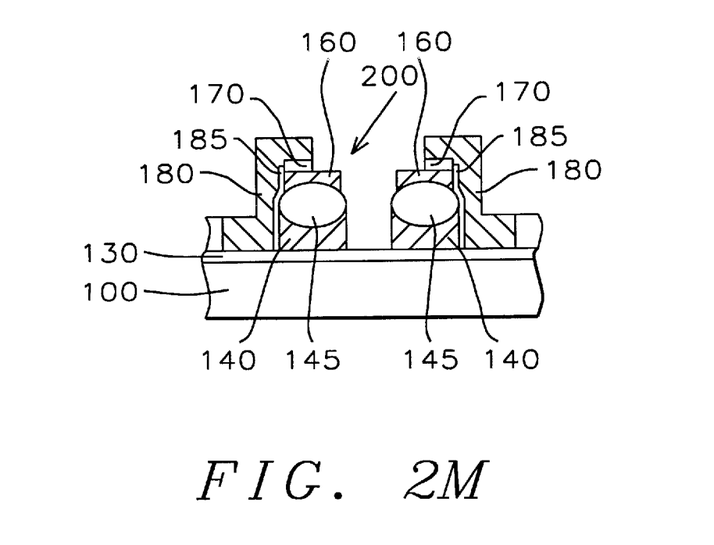
FIG. 2M is a cross-sectional view of the partially competed semiconductor substrate of FIG. 2L showing a cross-sectional view of the completed split-gate flash cell of this invention.

As a key feature of the instant invention, a continuos self-aligned source line is next formed by etching across the field oxide regions (110) left uncovered by a third patterned photoresist layer, (190), shown in FIG. 2J. FIG. 2K shows a cross-sectional view taken at 2K—2K shown in the top view of the substrate in FIG. 2J. Photoresist layer (190), having a thickness between about 1.0 to 1.2 μm, is patterned to form a mask such that a continuos region (200) is provided, that is, without the raised regions of field oxide formed earlier. The raised portions in region (200) are leveled by performing an etch with a recipe comprising gases $CF_4$, $CHF_3$ and He. The etchant has high selectivity with respect to the photoresist mask and the buffer polysilicon (160) so that field oxide regions (110) including the unprotected portion of the buffer poly-oxide (170) are removed as shown in FIG. 2M. Furthermore, the buffer polysilicon layer (160) performs the function of an etch stop to protect the first poly-oxide of the polysilicon floating gate during the self-aligned source etching. Subsequent to the etching, the third photoresist layer is removed by oxygen plasma ashing and the resulting top view of the substrate is shown in FIG. 2L. The continuos source line (200), common to devices in the active region is shown in both FIGS. 2L and 2K. The ion implantation of the source is accomplished with gas phosphorous, P, at a dosage between $2 \times 10^{15}$ to $8 \times 10^{15}$ atoms/cm$^2$ and energy level between about 30 to 60 KEV. The subsequent steps of forming contacts at the end of the source line, and remaining steps to complete the fabrication of the semiconductor substrate follow methods known in the art.

It will be appreciated from FIG. 2L of the disclosed invention that the area assigned to cells can be minimized through the use of the common source line (200). It will also be appreciated that the field oxide encroachment into the cell area has been alleviated through the source line etching. Hence, the over-all memory size can be reduced on both accounts.

While the invention has been particularly shown and described with reference to the preferred embodiments thereof, it will be understood by those skilled in the art that various changes in form and details may be made without departing from the spirit and scope of the invention.

What is claimed is:

1. A method of forming a self-aligned source comprising the step of:
    providing a semiconductor substrate;
    forming active and passive field oxide regions in said substrate;
    forming a floating gate oxide layer over said substrate;
    forming a first polysilicon layer over said floating gate oxide layer;
    forming a nitride layer over said first polysilicon layer;
    forming a first patterned photoresist layer having a floating gate pattern over said floating gate oxide layer;
    etching into said nitride layer through said floating gate pattern in said photoresist layer;
    removing said first patterned photoresist layer;
    oxidizing said first polysilicon layer to form a first poly-oxide layer;
    forming a buffer polysilicon layer over said first poly-oxide layer;
    removing a portion of said buffer polysilicon layer;
    oxidizing said buffer polysilicon layer to form a buffer poly-oxide;
    removing said nitride layer over said first polysilicon layer;
    etching said first polysilicon layer using said first poly-oxide as a hard mask until reaching said floating gate oxide layer;
    forming an interpoly oxide layer over said substrate;
    forming a second polysilicon layer over said interpoly oxide layer;
    forming a second patterned photoresist layer having a control gate pattern over said second polysilicon layer;
    etching through said second patterned photoresist layer to form a control gate in said second polysilicon layer;
    removing said second patterned photoresist layer;
    forming a third patterned photoresist layer over said control gate and defining a self-aligned source pattern;
    etching through said third patterned photoresist layer to remove portions of said field oxide to form a continuos common source line;
    ion implanting to form source regions; and
    removing said third patterned photoresist layer.

2. The method of claim 1, wherein said semiconductor substrate is silicon.

3. The method of claim 1, wherein said forming active and passive field oxide regions is accomplished by using LOCOS process.

4. The method of claim 1, wherein said forming a floating gate oxide layer is accomplished by thermal growth at a temperature between about 850 to 1100° C.

5. The method of claim 1, wherein said floating gate oxide has a thickness between about 50 to 100 Å.

6. The method of claim 1, wherein said forming a first polysilicon layer is accomplished by an LPCVD method employing silane (SiH$_4$) as a silicon source material at a temperature range between about 500 to 650° C.

7. The method of claim 1, wherein said first polysilicon layer has a thickness between about 800 to 1500 Å.

8. The method of claim 1, wherein said forming nitride layer is accomplished by reacting dichlorosilane (SiCl$_2$H$_2$) with ammonia (NH$_3$) in an LPCVD at a temperature between about 750 to 850° C.

9. The method of claim 1, wherein said nitride layer has a thickness between about 500 to 1500 Å.

10. The method of claim 1, wherein said first patterned photoresist layer has a thickness between about 1.0 to 1.2 μm.

11. The method of claim 1, wherein said etching into said nitride layer is accomplished with a recipe comprising gases CF$_4$, CHF$_3$ and Ar.

12. The method of claim 1, wherein said removing said first patterned photoresist layer is accomplished by oxygen plasma ashing.

13. The method of claim 1, wherein said oxidizing said first polysilicon layer to form a first poly-oxide is accomplished by wet oxidation at a temperature between about 850 to 1100° C.

14. The method of claim 1, wherein said forming a buffer polysilicon layer is accomplished by an LPCVD method employing silane (SiH$_4$) as a silicon source material at a temperature range between about 500 to 650° C.

15. The method of claim 1, wherein said removing a portion of said buffer polysilicon is accomplished by employing chemical-mechanical polishing.

16. The method of claim 1, wherein said oxidizing said buffer polysilicon layer is accomplished by wet oxidation at a temperature between about 850 to 1100° C.

17. The method of claim 1, wherein said removing said nitride layer is accomplished with a wet solution comprising H$_3$PO$_4$.

18. The method of claim 1, wherein said etching said first polysilicon layer using said first poly-oxide as a hard mask is accomplished with a recipe comprising gases HBr, Cl$_2$, and O$_2$.

19. The method of claim 1, wherein said interpoly oxide layer has a thickness between about 150 to 300 Å.

20. The method of claim 1, wherein said second patterned photoresist layer mask has a thickness between about 0.9 to 1.0 μm.

21. The method of claim 1, wherein said etching through said second patterned photoresist mask to form a control gate in said second polysilicon layer is accomplished with a recipe comprising gases HBr, Cl$_2$ and O$_2$.

22. The method of claim 1, wherein said removing said second patterned photoresist mask is accomplished by oxygen plasma ashing.

23. The method of claim 1, wherein said third patterned photoresist mask has a thickness between about 1.0 to 1.2 μm.

24. The method of claim 1, wherein said etching through said third patterned photoresist layer to remove portions of said field oxide to form a continuos common source line is accomplished with a recipe comprising gases $CF_4$, $CHF_3$ and He.

25. The method of claim 1, wherein said ion implanting to form source regions is accomplished with phosphorous at a dosage between about $2 \times 10^{15}$ to $8 \times 10^{15}$ atoms/cm$^2$ and energy level between about 30 to 60 KEV.

26. The method of claim 1, wherein said removing said third patterned photoresist layer is accomplished by oxygen plasma ashing.

27. A method of forming a self-aligned source comprising the steps of providing a semiconductor substrate having active and passive field oxide regions;

growing a floating gate oxide layer said substrate;

depositing a first polysilicon layer over said floating gate oxide layer;

depositing a nitride layer over said first polysilicon layer;

etching a cell opening in said nitride layer;

forming a first poly-oxide layer over said first polysilicon layer in said cell opening;

depositing a buffer polysilicon layer over said first poly-oxide layer;

forming a buffer poly-oxide over said buffer polysilicon layer;

removing said nitride layer over said first polysilicon layer;

forming a floating gate by etching said first polysilicon layer using said buffer poly-oxide as a hard mask;

growing an interpoly oxide layer over said substrate;

depositing a second polysilicon layer over said interpoly oxide layer;

forming a control gate in said second polysilicon layer by etching said second polysilicon layer;

forming a photoresist layer over said second polysilicon layer and patterning said photoresist layer with a source line self-aligned to said floating gate transverse to said field oxide regions;

performing self-aligned etch to form self-aligned source line across said field oxide regions;

forming self-aligned source;

and removing said photoresist layer.

28. The method of claim 27, wherein said floating gate oxide layer has a thickness between about 50 to 100 Å.

29. The method of claim 27, wherein said first polysilicon layer has a thickness between about 800 to 1500 Å.

30. The method of claim 27, wherein said nitride layer has a thickness between about 500 to 1500 Å.

31. The method of claim 27, wherein said first poly-oxide layer has a thickness between about 800 to 1700 Å.

32. The method of claim 27, wherein said buffer polysilicon layer has a thickness between about 500 to 1200 Å.

33. The method of claim 27, wherein said buffer poly-oxide layer has a thickness between about 250 to 600 Å.

34. The method of claim 27, wherein said interpoly oxide layer has a thickness between about 150 to 300 Å.

35. The method of claim 27, wherein said second polysilicon layer has a thickness between about 1000 to 2000 Å.

36. The method of claim 27, wherein said performing self-aligned etch to form self-aligned source line across said field oxide regions is accomplished with a recipe comprising gases $CF_4$, $CHF_3$ and He.

37. The method of claim 27, wherein said forming said self-aligned source is accomplished by ion implanting phosphorous at a dosage between about $2 \times 10^{15}$ to $8 \times 10^{15}$ atoms/cm$^2$ and energy level between about 30 to 60 KEV.

38. The method of claim 27, wherein said removing said photoresist layer is accomplished by oxygen plasma ashing.

* * * * *